United States Patent [19]
Mohamed et al.

[11] Patent Number: 6,014,512
[45] Date of Patent: Jan. 11, 2000

[54] METHOD AND APPARATUS FOR SIMULATION OF A MULTI-PROCESSOR CIRCUIT

[75] Inventors: Moataz Ali Mohamed, Santa Clara, Calif.; Ian J. Rickards, Cambridge, United Kingdom

[73] Assignee: Samsung Electronics Co., Ltd., Seoul, Rep. of Korea

[21] Appl. No.: 08/730,866

[22] Filed: Oct. 18, 1996

[51] Int. Cl.[7] .............................. G06F 11/26; G06F 15/16
[52] U.S. Cl. .................. 395/500.48; 395/500.47
[58] Field of Search .............................. 395/500; 364/578

[56] References Cited

U.S. PATENT DOCUMENTS

| | | | |
|---|---|---|---|
| 5,603,012 | 2/1997 | Sotheran | 395/500 |
| 5,721,953 | 2/1998 | Fogg, Jr. et al. | 395/841 |
| 5,758,176 | 5/1998 | Agarwal et al. | 395/800 |

OTHER PUBLICATIONS

Bagrodia et al., The Maisie Environment for Parallel Simulation, IEEE, pp. 4–12, 1994.

Apduhan et al., Experiments of a Reconfigurable Multiprocessor Simulation on a Distributed Environment, IEEE, pp. 539–546, 1992.

Braunl, Designing Massively Parallel Algorithms with Parallaxis, IEEE. pp. 612–617, 1991.

Eric Reither et al., (Article entitled "Simulating Networks of Superscalar Processors", 1994 IEEE, pp. 125–133), 1994.

*Primary Examiner*—Kevin J. Teska
*Assistant Examiner*—Lonnie A. Knox
*Attorney, Agent, or Firm*—Skjerven, Morrill, MacPherson, Franklin & Friel LLP; Fabio E. Marino; Paul E. Lewkowicz

[57] ABSTRACT

Multiple processor circuit simulator comprising a debugger interface, a synchronizer, a RISC processor simulator, a vector processor simulator, a shared memory, a co-processor interface module and an events module. The multiple processor simulator tightly couples the RISC processor simulator and vector processor simulator into a single executable process and a single address space. The synchronizer interleaves simulation of instruction execution between multiple processor simulators. The synchronizer determines which processor simulator to execute based on a furthest-behind clocking scheme. The clocking scheme is implemented by comparing the values held in clock simulators corresponding to the processor simulators.

12 Claims, 6 Drawing Sheets

METHOD AND APPARATUS FOR SIMULATION OF A MULTI-PROCESSOR CIRCUIT

CROSS REFERENCE TO APPENDIX A

Appendix A, which is a part of this disclosure, is a computer program embodiment of the present invention, which is described more completely below. Appendix A contains material which is subject to copyright protection. The copyright owner has no objection to the facsimile reproduction by anyone of the patent document or the patent disclosure, as it appears in the United States Patent and Trademark Office patent files or records, but otherwise reserves all copyright rights whatsoever.

BACKGROUND OF THE INVENTION

1. Field of the Invention

The present invention relates to the simulation of a circuit and, in particular, to the simulation of a dual processor circuit.

2. Background

Normally, there is a significant time-gap between electronic circuit design and high-volume production of the newly designed circuit. Prior to investing in costly mass production, manufacturers test the circuit for assurance that the circuit design is valid. A physical limitation to the testing of circuits is imposed by the high cost of building circuits on an individual scale. To overcome the cost of low-volume circuit production, designers have turned to computer simulation of newly designed circuits to provide low-cost, robust testing of new circuit designs.

Communication between computer simulators commonly involves using temporary files. One simulator allocates a temporary file, writes to it and then deallocates it. The second simulator allocates that same temporary file, reads the data to be communicated and deallocates it. Consequently, communication between two simulators entails a long instruction chain resulting in poor performance. Other common methods of communicating between simulators are pipe and buffer structures. Managing these structures also entails overhead. Furthermore, traditional simulators do not simulate the communication capabilities present in the underlying hardware. For example, circuit components don't typically communicate via a temporary file. What is needed is a simulator of a dual processor circuit that will have better performance than traditional simulators. Furthermore, what is needed is a simulator that accurately simulates the communication operations existing in the underlying electronic circuit.

SUMMARY OF THE INVENTION

According to the principles of this invention, a novel dual processor circuit simulator tightly couples separate simulators and interleaves execution of instructions among them. This novel dual processor simulator provides accurate high performance simulation of the operation of the underlying monolithic circuit.

In one embodiment, a synchronizer manages the coordinated operation of a RISC processor simulator and a vector processor simulator. Input to the dual processor simulator consists of a combined executable file that combines an executable file of the underlying RISC processor with an executable file of the underlying vector processor. The synchronizer fetches an instruction from the combined executable file associated with the RISC processor in an outer loop. The synchronizer terminates operation when all of the instructions associated with the RISC processor have been executed.

The synchronizer calls the RISC processor simulator to simulate execution of the fetched instruction unless the fetched instruction signals that the vector processor should be initialized. When the vector processor is required, the synchronizer simulates parallel processing.

To simulate parallel processing, the synchronizer first starts the vector processor simulator and then it sets a clock simulator corresponding to the RISC processor simulator to an initial time. A second clock simulator corresponding to the vector processor simulator is set to the same initial time.

The synchronizer executes an inner loop for as long as parallel processing is required. When parallel processing is no longer required, the synchronizer returns to the outer loop. In the inner loop, the synchronizer compares the RISC clock simulator with the vector clock simulator. If the RISC clock simulator is further behind, then the synchronizer fetches a RISC instruction from the combined executable program. This instruction is simulated on the RISC processor simulator. After simulation, the amount of time the RISC processor would require to execute the instruction is added to the value of the RISC clock simulator. The synchronizer returns to the top of the inner loop.

If the vector clock simulator is equal to or behind the RISC clock simulator then the synchronizer fetches a vector processor instruction from the combined executable program. This instruction is simulated on the vector processor simulator. After simulation, the amount of time the vector processor would require to execute the instruction is added to the value of the vector clock simulator. Then the synchronizer returns to the top of the inner loop.

Communication between the RISC processor simulator and the vector processor simulator is accomplished through use of a shared memory. The RISC processor simulator can write to and read from a vector processor simulator register.

DETAILED DESCRIPTION OF THE PREFERRED EMBODIMENTS

According to the principles of this invention, methods and apparatus are provided for simulating the operation of a multiple processor circuit. In some embodiments the simulated circuit is a dual processor monolithic circuit. In some embodiments of the present invention, a novel dual clocked simulation method interleaves instruction execution simulation between two separate tightly coupled processor simulators. Two separate processor simulators, representing dual processors on a monolithic circuit, are integrated into a single shared address space. The two processor simulators share memory through which they can communicate. In general, instruction execution is synchronized so that the processor simulators take turns simulating instruction execution. In this manner, parallel execution available on the monolithic circuit is simulated. A separate clock simulator is kept for each processor simulator. The actual processor simulator picked to simulate execution of the next instruction is the processor simulator associated with the clock simulator that is furthest behind. Directing simulation of instruction execution in this way ensures that the order of instruction execution will be within one instruction of the execution order of the actual dual processor monolithic circuit.

Figure 1:
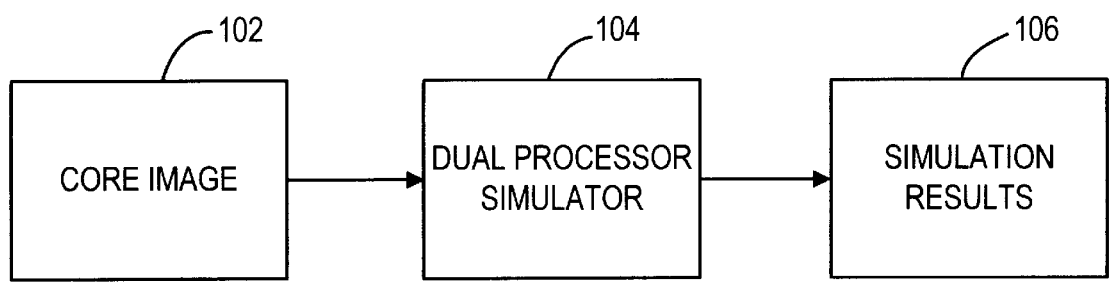
FIG. 1 is a block diagram of the inputs and outputs to one embodiment of the present invention.

FIG. 1 illustrates one embodiment of the present invention. A core image 102 is a combined executable file composed of the executable files for two different programs. In one embodiment of the present invention, one program is designed to operate on an ARM7 processor ("ARM7 processor program") and the other program is designed to operate on a vector processor ("vector processor program"). Each program's executable file contains a code segment area and a data segment area. The two different programs can have shared variables as well as private variables. An exemplary outline of core image 102 is presented in Appendix B. In Appendix B, core image 102 contains, in order, the code segment for the ARM7 processor program (lines A1–A4), the data segment for the ARM7 processor program (line A5), the code segment for the vector processor program (lines A6–A7) and the data segment for the vector processor program (line A8). It is core image 102 which is the input to a dual processor simulator 104.

Dual processor simulator 104 is an instruction-level simulator. Dual processor simulator 104 simulates parallel instruction execution on two processors by interleaving simulation of instruction execution among two processor simulators. In one embodiment of the present invention, one processor simulator simulates the operation of an ARM7 RISC processor and the other processor simulator simulates the operation of a vector processor. An architecture and instruction set for an ARM7 RISC processor is described in the "ARM7DM Data Sheet", Document Number: ARM DDI 0010G which is available from Advanced RISC Machines Ltd, Cambridge England. The ARM7DM Data Sheet is hereby incorporated herein by reference in its entirety. ARM7 registers and instructions are also described in U.S. pat. app. Ser. No. 08/699,303, attorney docket No. M-4368, entitled "METHODS AND APPARATUS FOR PROCESSING VIDEO DATA", which is hereby incorporated herein by reference in its entirety. ARMULATOR, one example of an ARM7 RISC processor simulator, is commercially available from Advanced RISC Machines Ltd., Cambridge England. The ARMULATOR is further described in Appendix C. An architecture and instruction set for a vector processor is described in "MSP Architecture Specification" and "Preliminary MSP-1EX System Specification", both of which are available from Samsung Semiconductor of San Jose, Calif. and are incorporated herein by reference. Vector processor registers and instructions are also described in U.S. pat. app. Ser. No. 08/699,597, attorney docket No. M-4355, entitled "SINGLE-INSTRUCTION-MULTIPLE-DATA PROCESSING IN A MULTIMEDIA SIGNAL PROCESSOR", which is hereby incorporated herein by reference in its entirety. One example of a vector processor simulator is Multimedia Instruction Level Simulation Tool (MINT) which is disclosed in "Architecture and Design Specification of MINT" available from Samsung Semiconductor of San Jose, Calif. and is incorporated herein by reference.

The ARM7 RISC processor and vector processor are illustrative only and are not intended to limit the invention to the particular processor simulators described. In view of this disclosure, the principles of this invention can be used to simulate any dual processor circuit, notwithstanding the specific architecture of the processors so long as an appropriate processor simulator is employed. For example, the ARM7 RISC processor could be replaced by a conventional-architecture, general-purpose processor.

Dual Processor Simulator 104 tightly couples the ARM7 processor simulator and vector processor simulator in a single shared address space. These two different processor simulators are run together as one process with the operation of each processor simulator acting as a thread underneath the umbrella process. Dual processor simulator 104 interleaves simulation of instruction execution. For example, the ARM7 processor simulator simulates instruction execution and then the vector processor simulator simulates instruction execution and then followed again by operation of the ARM7 processor simulator. Operation continues in this leap-frog pattern until there are no longer any instructions that need to be executed in parallel.

Dual processor simulator 104 determines which processor simulator will operate next through a furthest-behind clocking technique. A separate clock simulator is kept for each processor simulator. Before an instruction is fetched, the two clock simulators are compared to determine which one is further behind. The processor simulator associated with the clock simulator that is furthest behind is the next processor simulator to simulate execution of an instruction.

The operation of dual processor simulator 104 maintains synchronization between the two processor simulators such that instructions are never executed out of order by more than one instruction as compared to the execution order on the dual processor monolithic circuit. By simulating execution of instructions in this way there is minimal overhead. Dual processor simulator 104 produces simulation results 106 which mimic the results received from the dual processor monolithic circuit operating on core image 102 input. Simulation results 106 also contain performance data which indicates how many cycles were needed to process core image 102. Simulation results 106 provide reasonably accurate information which can be used to debug code and obtain performance figures.

Figure 2:
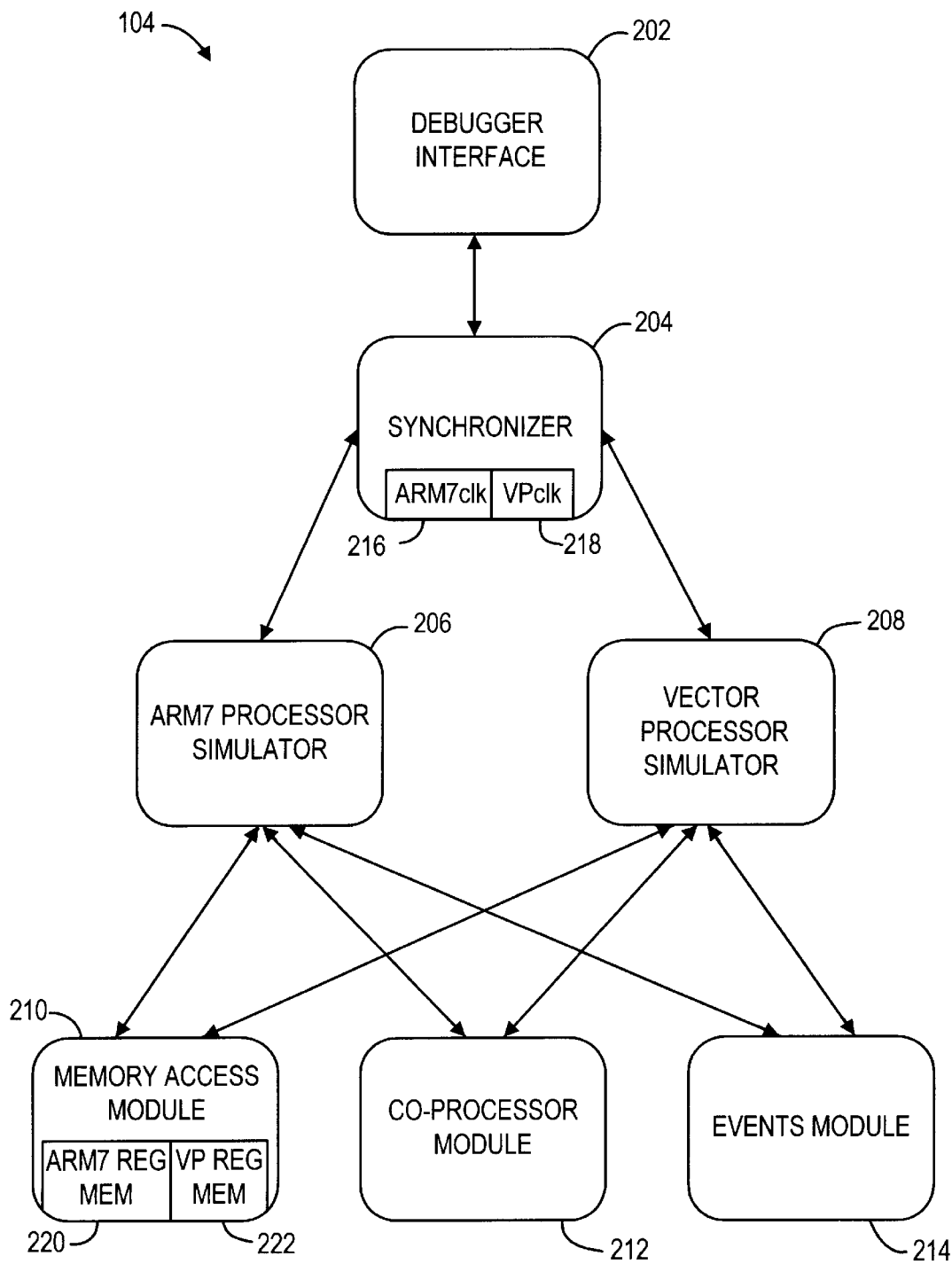
FIG. 2 is an illustration of the architecture of the dual processor simulator of FIG. 1.

According to one embodiment of the present invention, the architecture of dual processor simulator 104 is shown in greater detail in FIG. 2. The top layer of dual processor simulator 104 is a debugger interface 202. Debugger interface 202 accepts synchronizer control and debug commands from the user. Debugger interface 202 accepts commands to perform functions such as display registers, list a group of program instructions, and change variables. In one embodiment of the present invention, debugger interface 202 conforms to the specifications for a Windows 95™ user interface. Windows 95™ is available from Microsoft Corporation of Redmond, Wash.

Synchronizer 204 is a control layer between debugger interface 202 and the remaining components of dual processor simulator 104. Debugger interface 202 passes commands to and receives data from synchronizer 204. Synchronizer 204 contains a memory location ARM7clk 216 (for simulating an ARM7 processor clock) and a memory location VPclk 218 (for simulating a vector processor clock). Synchronizer 204 is linked to two processor simulators: an ARM7 processor simulator 206 (also referred to herein as "ARM7 simulator 206") and a vector processor simulator 208 (also referred to herein as "VP simulator 208"). Information can flow in both directions between synchronizer 204 and each of the two processor simulators 206 and 208.

ARM7 simulator 206 and VP simulator 208 share a memory access module 210, a co-processor module 212 and an events module 214. Part of memory access module 210 is visible to both processor simulators 206 and 208. Memory access module 210 allows the two processor simulators to maintain both private and shared variables. Memory access module 210 has a memory location ARM7 reg mem 220 to hold contents of the ARM7 simulator 206 registers and a memory location VP reg mem 222 to hold contents of the VP simulator 208 registers. Co-processor module 212 accomplishes data transfer between both of the processor simulators. Events module 214 processes events such as reset, exceptions and interrupts. Memory access module 210, co-processor module 212 and events module 214 do not communicate directly.

Tightly integrating ARM7 simulator 206 with VP simulator 208 achieves a close duplication of the dual processor circuit architecture. For example, vector processor simulator 208 can write to a status register variable stored in VP ref reg mem 222 representing a status register on the dual processor monolithic circuit and ARM7 simulator 206 can poll that same status register variable to achieve communication between the processor simulators. Alternatively, ARM7 simulator 206 could write to a register polled by VP simulator 208. This communication through memory access module 210 is more efficient than using a file, pipe or shared buffer to achieve communication between the two processor simulators. These alternatives require additional resource management and access operations which degrade performance. For example, in some operating systems, communicating via a file would require VP simulator 208 to open that file, write to the file, close the file and then ARM7 simulator 206 must itself open that same file, read from it and close it. Using memory access module 210 in the manner described above eliminates extra steps by achieving communication through simulation of normal processor operation.

Figure 3:
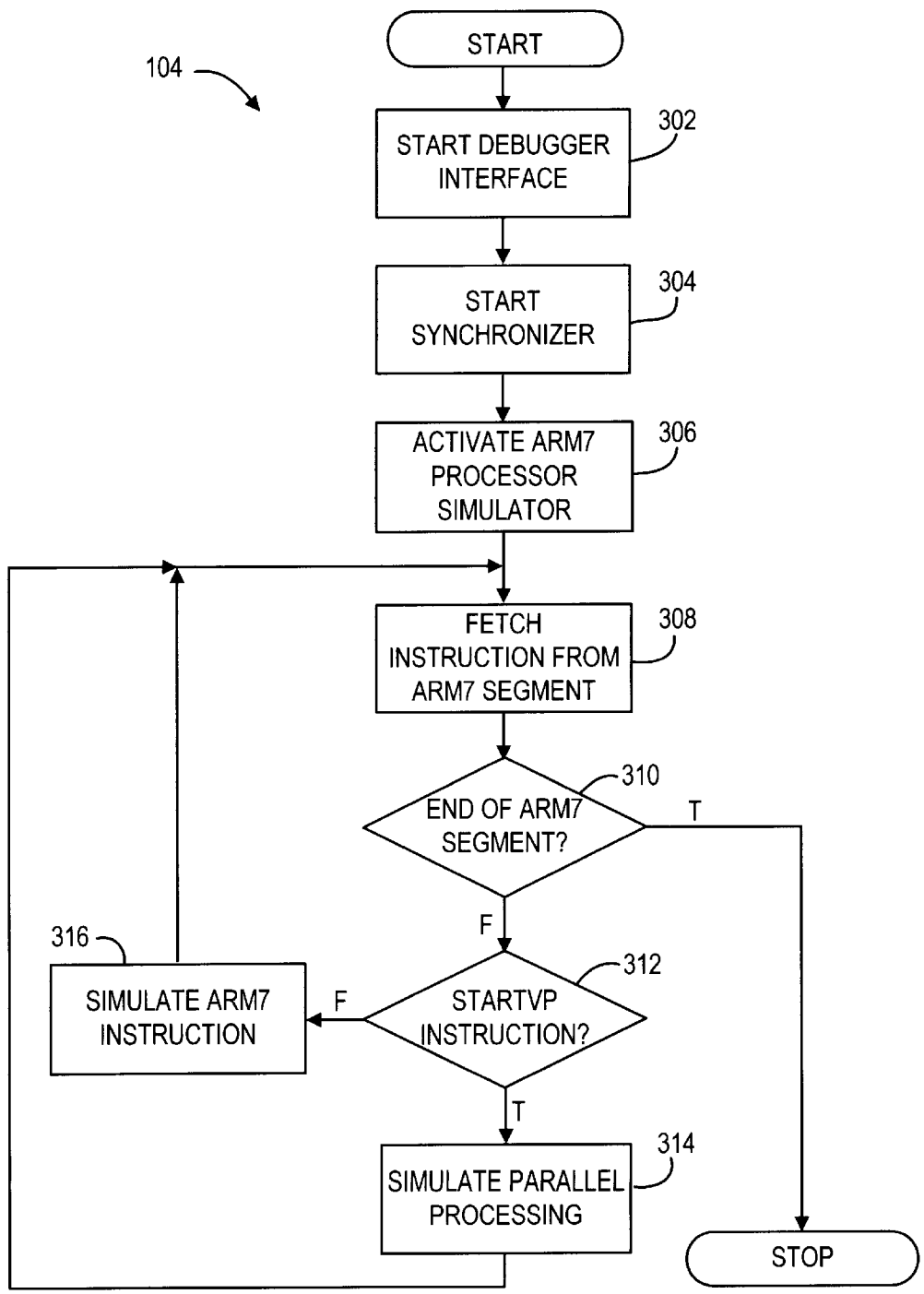
FIG. 3 is a logic flow diagram of one embodiment of the dual processor simulator of this invention.

The operation of dual processor simulator 104 is shown in greater detail in FIG. 3. First, "Start Debugger Interface" block 302 starts debugger interface 202 (FIG. 2). At "Start Synchronizer" block 304, the user requests simulation of instructions executing on the dual processor circuit and debugger interface 202 calls synchronizer 204 (FIG. 2). Synchronizer 204 synchronizes the simulation of instruction operation in an interleaved manner between ARM7 simulator 206 and VP simulator 208 to approximate the parallel execution that will occur on the dual processor circuit.

After synchronizer 204 is started, at "Activate ARM7 Processor Simulator" block 306, synchronizer 204 starts ARM7 simulator 206 (FIG. 2). In the dual processor circuit, the ARM7 processor and the vector processor have a master-slave relationship. Operation of the vector processor is started via an instruction, "STARTVP" (Appendix B, line A2), executed on the ARM7 processor. To simulate this relationship, ARM7 simulator 206 is activated first. One skilled in the art will realize that an instruction does not have to be named "STARTVP" in order to be used as a signal to start the vector processor.

Following the activation of ARM7 simulator 206, synchronizer 204 executes "Fetch Instruction From ARM7 Segment" block 308. In block 308, synchronizer 204 retrieves an instruction from the code segment of core image 102 that corresponds to the ARM7 processor program (Appendix B, lines A1–A4). At "End of ARM7 Segment" decision 310, synchronizer 204 checks to make sure that ARM7 program has not terminated, that is, if an ARM7 instruction was successfully fetched in block 308. If the ARM7 program has ended, synchronizer 204 terminates, returning to debugger interface 202.

If synchronizer 204 successfully fetched an instruction in block 308, synchronizer 204 determines in "STARTVP Instruction" decision 312 whether this instruction is "STARTVP". If the instruction fetched by synchronizer 204 in block 308 is the "STARTVP" instruction, then processing transfers to "Simulate Parallel Processing" block 314. Up until the time a "STARTVP" instruction is encountered, the single process that is under the control of synchronizer 204 contains a single thread—the thread that is associated with the operation of ARM7 simulator 206. A "STARTVP" instruction is requesting that another thread be created—a thread associated with the operation of VP simulator 208. Block 314 is discussed in detail below under the heading "Parallel Processing".

If the instruction fetched in block 308 is not "STARTVP", then synchronizer 204 makes a function call to ARM7 simulator 206 to simulate execution of the fetched instruction in "Simulate ARM7 Instruction" block 316. In another embodiment of the present invention, synchronizer 204 makes a subroutine call to engage ARM7 simulator 206. The particular way in which synchronizer 204 engages ARM7 simulator 206 depends upon the programming implementation of these two components. After block 316 finishes processing, ARM7 simulator 206 returns to synchronizer 204 and control loops back to block 308 to read additional instructions from the ARM7 program (Appendix B, line A1).

PARALLEL PROCESSING

Figure 4:
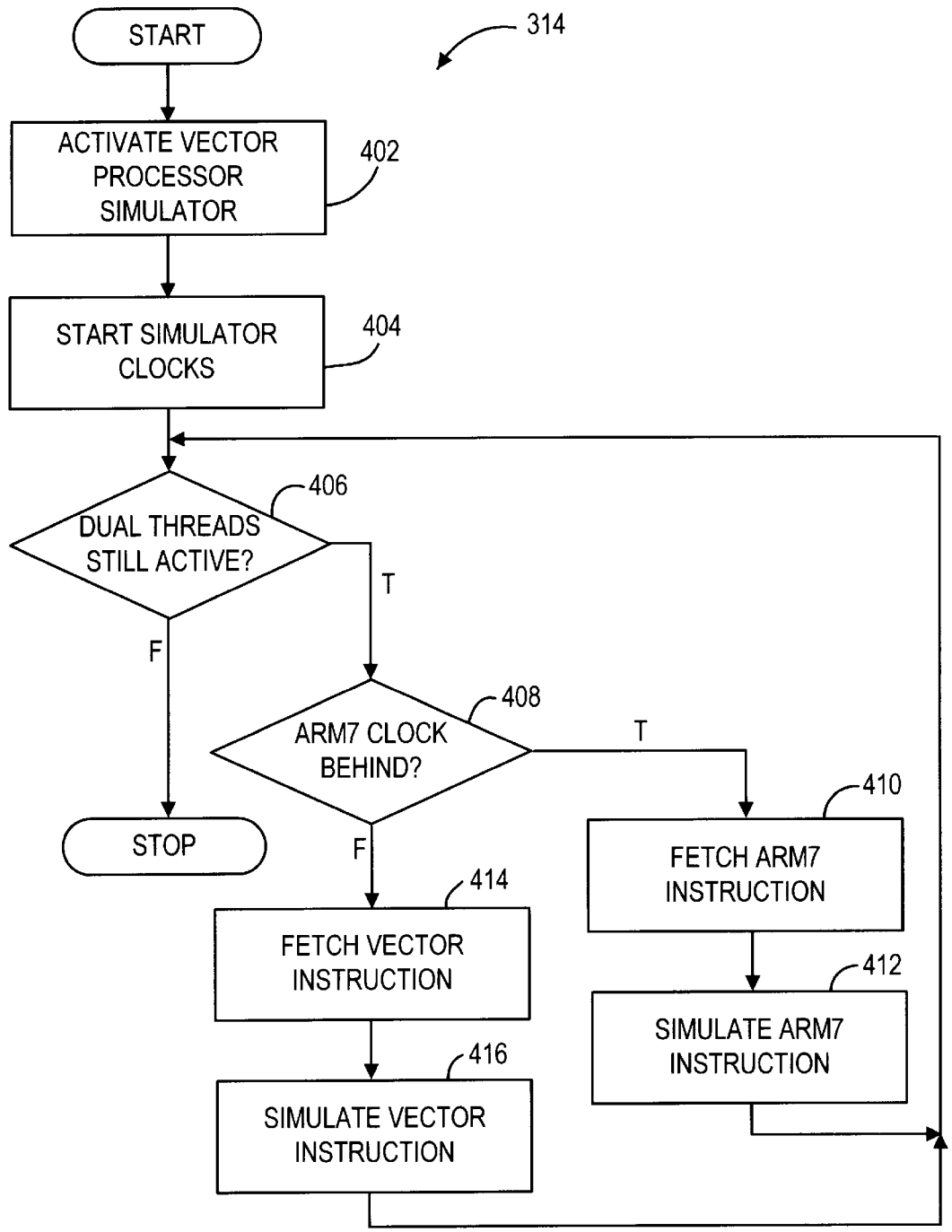
FIG. 4 is a logic flow diagram representing the processing performed in the simulate parallel processing block of FIG. 3.
Figure 5:
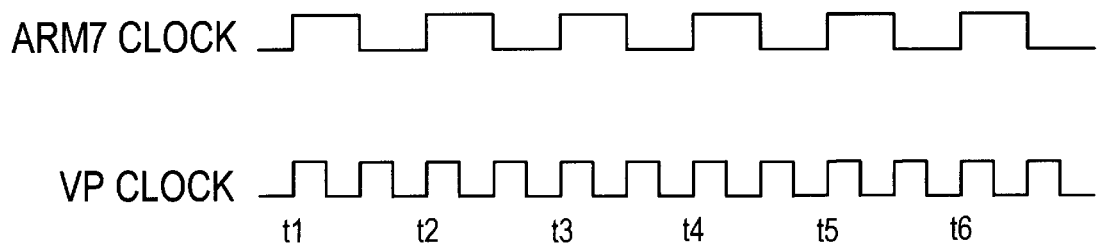
FIG. 5 illustrates the clocks of the processors simulated by the simulator of FIG. 2.

Block 314, as described earlier, is responsible for simulating the parallel execution of instructions on the ARM7 processor and the vector processor of the dual processor monolithic circuit. Block 314 is illustrated in FIG. 4. Simulation begins in "Activate Vector Processor Simulator" block 402 in which synchronizer 204 activates VP simulator 208. After VP simulator 208 is ready to process instructions, synchronizer 204 executes "start simulator clocks" block 404. Synchronizer 204 keeps two separate clock simulators to time processor simulators 206 and 208: one clock simulator simulates an ARM7 clock (FIG. 5) and the other clock simulator corresponds to a vector clock (FIG. 5). The ARM7 clock simulator includes a memory location ARM7clk 216 (FIG. 2). The vector clock simulator includes a memory location VPclk 218 (FIG. 2). In block 404, synchronizer 204 initializes ARM7clk 216 and VPclk 218 to a value t1 (FIG. 5). In one embodiment, the ARM7 clock simulation runs at a frequency of 40 MHz and the vector clock simulation runs at a frequency of 80 MHz. The frequencies of the two clock simulators are illustrative only and are not intended to limit the invention to the particular frequencies described. In view of this disclosure, the principles of this invention can be utilized with clock simulators of any frequency. Synchronizer 204 uses these two clock simulators, as discussed in more detail below, to determine which of the two processor simulators should receive an instruction and execute next.

Synchronizer 204 continues to "Dual Threads Still Active" decision 406. If both threads are not still active, then processing for one of the processor simulators has ended;

thus parallel processing is no longer required. If parallel processing is no longer required, block 314 terminates.

If both threads are still active, then processing transfers to "ARM7 clock behind" decision 408. In decision 408, synchronizer 204 determines if the ARM7 clock simulator is further behind than the vector clock simulator. This check is made by comparing ARM7clk 216 against VPclk 218. For example, if ARM7clk 216=t1 and VPclk 218=t3 (FIG. 5) then the ARM7 clock simulator is further behind. If the ARM7 clock is further behind, this indicates that VP simulator 208 has been processing an instruction while ARM7 simulator 206 has been idle. In the dual processor circuit, because there are two processors, both processors would be operating concurrently. If ARM7 simulator 206 has been idle, then it should process the next instruction so that the order of instruction execution is maintained and parallelism is simulated. For example, referring to FIG. 5, if VP simulator 208 has simulated vector processor operation for a duration of time t4 while ARM7 simulator 206 has simulated ARM7 processor operation for a duration of time t2, then the next processor to execute should be ARM7 simulator 206. ARM7 simulator 206 should continue to process instructions until it has been operating for at least the same amount of time as VP simulator 208. It can be seen, that because some instructions will take a different amount of time to complete, synchronizer 204 will deviate from strict interleaving of instruction execution among the two processor simulators to let the processor simulator that has been waiting idle the longest execute more instructions.

When the ARM7 clock simulator is further behind than the vector clock simulator (i.e. ARM7clk 216<VPclk 218), processing transfers to "Fetch ARM7 Instruction" block 410 in which synchronizer 204 fetches an instruction from the code segment of the ARM7 program in core image 102 (Appendix B, line A3–A4). After the instruction is fetched, processing is transferred to "Simulate ARM7 Instruction" block 412 where synchronizer 204 calls ARM7 simulator 206 to simulate execution of the ARM7 processor instruction. Also as part of simulating instruction execution, synchronizer 204 adds to ARM7clk 216 the time it would take to execute the simulated instruction on the ARM7 processor. For example, referring to FIG. 5, if ARM7 simulator 206 started executing at ARM7clk 216=t1 and the time required to execute the instruction is one clock cycle on the ARM7 processor, then ARM7clk 216 would be set to t2. After execution of the ARM7 instruction has been simulated, processing control transfers to decision 406 to form a loop simulating parallel execution of instructions.

In one embodiment of the present invention, it is possible that the ARM7 processor will perform a wait loop while waiting for the vector processor to complete execution (Appendix B, line A4). When ARM7 processor simulator 206 is simulating a wait loop, both threads are still active and parallel processing is simulated.

If the ARM7 clock simulator was not behind the vector clock simulator (i.e., ARM7clk 216>=VPclk 218), processing transfers to "Fetch Vector Instruction" block 414 and then to "Simulate Vector Instruction" block 416. In another embodiment, when the two clock simulators are equal, synchronizer 204 calls ARM7 processor simulator 206 to simulate execution of an ARM7 program instruction. In block 414 of FIG. 4, analogous to processing when the ARM7 clock simulator is behind, synchronizer 204 fetches an instruction from the code segment of the vector program in core image 102 (Appendix B, line A6–A7). In block 416 synchronizer 204 calls VP simulator 208 to simulate execution of the instruction. As part of vector program instruction execution simulation, synchronizer 204 increases VPclk 216 by the amount of time required to execute the instruction on the vector processor. After block 416, processing control is transferred to decision 406 to form a loop simulating parallel execution of instructions.

Of special note in one embodiment of the present invention is the vector processor instruction "JOIN" (Appendix B, line A7). A counterpart to the ARM7 instruction "STARTVP", "JOIN" indicates that the vector program has terminated, the thread for VP simulator 208 should be canceled and processing should return to the master ARM7 program. One skilled in the art will realize that an instruction does not have to be named "JOIN" in order to be used as a signal to terminate the vector processor.

One benefit of tight coupling of ARM7 simulator 206 and VP simulator 208 is that synchronizer 204 avoids the traditional overhead encountered in context and task switching. Synchronizer 204 can call either processor simulator (ARM7 simulator 206 in block 412 or VP simulator 208 in block 416). One skilled in the art will realize that synchronizer 204 is essentially task switching between the two processor simulators. If the two processor simulators 206 and 208 were not tightly coupled, one processor simulator would have to be stopped and the other one would have to be started every time the instruction type changes from the type previously simulated and thus requires a new simulator to be run (i.e., change from an ARM7 instruction to a vector processor instruction or from a vector processor instruction to an ARM7 instruction).

Figure 6:
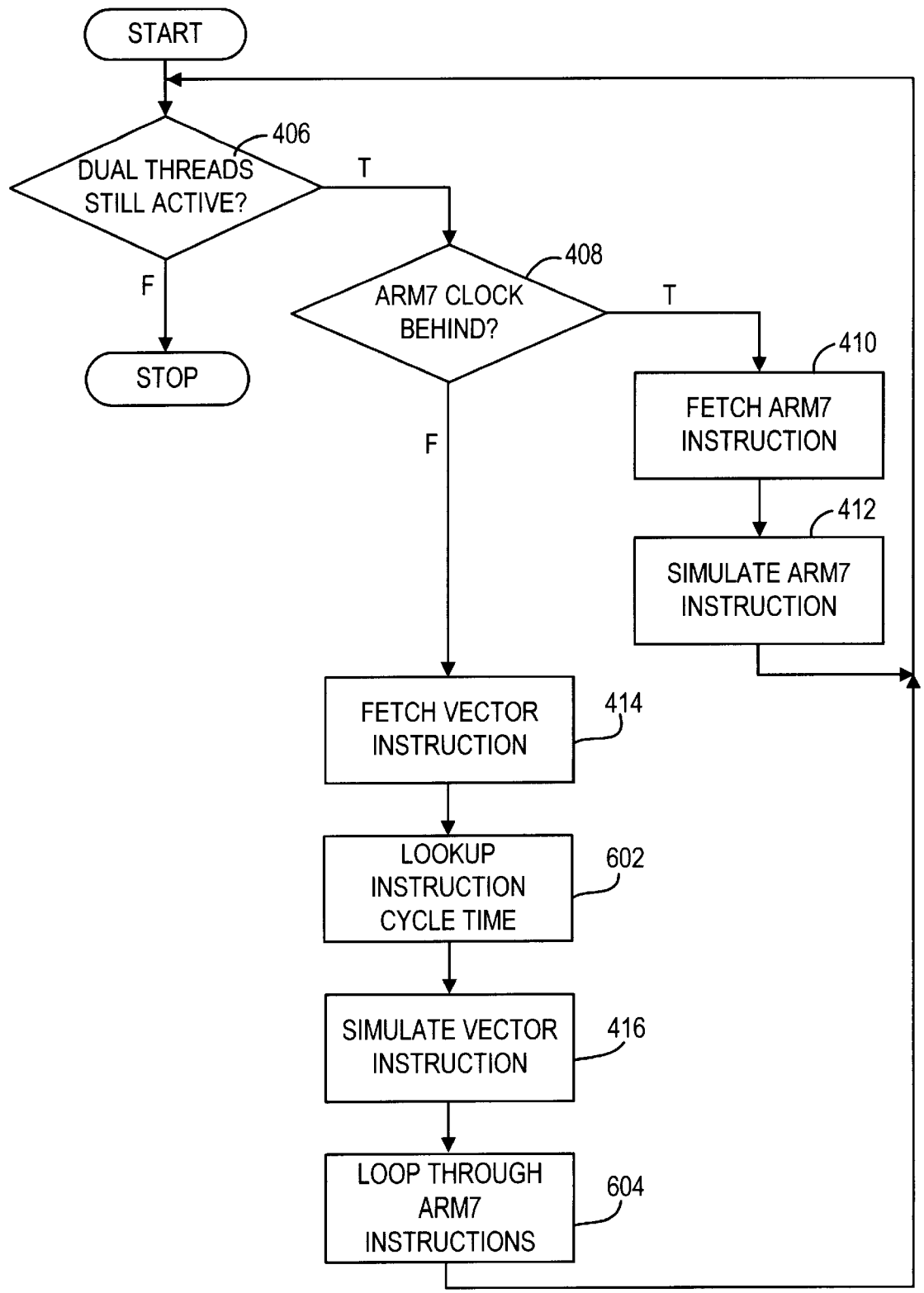
FIG. 6 illustrates an alternative embodiment of the present invention that reduces the frequency of clock simulator comparisons disclosed in FIG. 4.

In another embodiment of the present invention, the loop described in FIG. 4 that begins with decision 406 is modified to reduce the number of clock comparisons required. In FIG. 4, synchronizer 204 compares ARM7clk 216 and VPclk 218 after each instruction executed. FIG. 6 illustrates the modified loop which is identical to the loop disclosed in FIG. 4, except for the addition of blocks 602 and 604.

A clock-cycle lookup table (not shown) is constructed in synchronizer 204 that contains the number of clock cycles each vector instruction requires. Before instruction execution of a vector instruction is simulated, after block 414, but before block 416, at "Lookup Instruction Cycle Time" block 602 the synchronizer 204 searches the clock-cycle lookup table to determine how many cycles the instruction will require. Usually, instructions on the ARM7 processor require one cycle while instructions on the vector processor require multiple clock cycles. Following block 602, "Simulate Vector Instruction" block 416 executes as described above. After simulation of a vector instruction, instead of comparing ARM7clk 216 and VPclk 218, at "Loop Through ARM7 Instructions" block 604 the synchronizer 204 fetches and simulates execution of a number of ARM7 instructions equal to half the number of clock cycles required by the vector instruction. For example, assume processing begins at time=t1 (FIG. 5) and a vector processor instruction requiring eight clock cycles is simulated. The vector processor simulator would finish instruction execution at time=t5. Since the VP clock simulator is twice as fast as the ARM7 clock simulator, ARM7clk 216 will be only four (4) clock cycles, as opposed to eight (8) clock cycles, behind VPclk 216. Synchronizer 204 will fetch four (4) ARM7 instructions and then simulate the execution of these instructions by calling ARM7 simulator 206. Following the process disclosed in FIG. 4, synchronizer 204 would normally make four (4) clock comparisons after the vector instruction fetched in block 414 is simulated. The method disclosed in FIG. 6 eliminates the need for those four (4) clock comparisons. Following block 606, processing continues in the same manner as in FIG. 4 following block 416.

The computer program in Appendix A was compiled and linked, in one embodiment, using the Microsoft Visual C++ 4.0 integrated development environment available from Microsoft Corporation of Redmond, Wash. and which can be used on a personal computer using Microsoft Windows 95™, which is also available from Microsoft Corporation. In a second embodiment, the computer program in Appendix A can be compiled and linked using the UNIX Solaris™ 2.5 operating system and the GCC compiler and linker. Solaris is a trademark of Sun Microsystems, Inc. of Palo Alto, Calif. The particular computer language to which the computer program in Appendix A conforms and the computer system on which a computer process defined by the computer program of Appendix A is executed are not an essential aspect of this invention. In the exemplar computer program in Appendix A, the ARM7 processor simulator is referred to as "ARM." The vector processor simulator is referred to as "VCP." In view of this disclosure, those skilled in the art can implement the invention using a different computer language and/or a different computer system.

The above description is illustrative only and is not limiting. For example, while the disclosed embodiment simulates an ARM7 processor and a vector processor, the principles of the present invention are applicable to other processor types including, without limitation, those described above. Some embodiments simulate execution of more than two processors. In some embodiments, the multi-processor circuit is not monolithic. The present invention is limited only by the claims which follow.

APPENDIX A

```
/*    Synchronize the ARM and VCP
 *    If VCP is IDLE run/step ARM
 *    NumVcpCycles contains the number of cycles available for VCP
 *    execution
 *    if RUN do as many instructions as available cycles
 *    if STEP run one instruction and then break
 *    telling debugger that it was a VCP instruction
 */
    if (state->vcp.UER_Regs[VPSTATE].int_val & UER_MASK &&
        (state->NumVcpCycles > 0)) {
        /* VCP is running and there are cycles available */
        do {
            int nCount = state->vcp.CycleCount ;
            if (state->CallDebug > 0) {
                /* check for breakpoint */
                ARMword pc = state->vcp. SP_Regs[VPC].int_val;
                ARMul_Debug(state, pc, 0) ;
                if (state->Emulate < ONCE) {
                    state->Emulate = ONCE;
                    break ;
                }
            }
            VCP_DoInstr(state) ;   /* Emulate VCP instruction */
            state->NumVcpCycles -=    (state->vcp. CycleCount -
                                        nCount);
        } while (state->Emulate == RUN && (state->NumVcpCycles > 0) &&
        (state->vcp.UER_Regs[VPSTATE].int_val & UER_MASK)) ;
            if   (state->Emulate == ONCE) {
            state->Emulate = STOP ;
            state->NextInstr = RESUME ;
            if {state->EndCondition == RDIError_BreakpointReached)
                state->EndCondition = RDIError_VcpBreakpointReached ;
            else
                state->EndCondition = RDIError_VCPInstruction ;
            break ;
            }
        }
/*    ************************************************************  *\
 *            Execute the next instruction                           *
\*    ************************************************************  */
#    ifdef CYCLEBASED
        instr = state->instr ;
        decoded = state->decoded ;
        loaded = state->loaded ;
        pc = state->pc ;
        temp = state->temp ;
        instruction_size = INSTRUCTIONSIZE;
        has_halfword_prop = state->Processor & ARM_Halfword_Prop;
        if (state->EventSet)
            ARMul_InvokeEvent(state) ;
#    ifdef MODE32
        UNDEF_Prog32SigChange ;
        UNDEF_Data32SigChange ;
        #endif
        if (state->NresetSig = = LOW) {
            if (state->Reseted) {
                state->NrwSig = LOW ;
                ADDRWORD;
                state->NopcSig = LOW ;
```

APPENDIX A-continued

```
            state->lockSig = LOW ;
            SCYCLE ;
            state->NcpiSig = HIGH ;
            state->doutenSig = LOW ;
            state->LSCActive = FALSE ;
            state->NextCycle = RESET1 ;
            state->NexecSig = 1 ;
            }
        else
            state->Reseted = TRUE ;
        }
else {
    switch (state->LastCycle) {
case NEWINSTR :
    PREFETCH(loaded, pc + instruction_size * 2) ;
    break;
    case DESTPC3 :
        /* !! NOT instruction_size * 2 */
        PREFETCH(loaded,pc + instruction_size) ;
        break ;
    case STR2 :
    case STRB2 :
    case STRH2 :
        state->doutenSig = LOW ;
        if (state->abortSig || state->Aborted) {
            if (!state->lateabtSig)
                LSBase = state->OldBase ;
            if (!state->Aborted)
                state->Aborted = ARMul_DataAbortV ;
            if (state->Processor & ARM_Abort7_Prop)
                state->NextCycle = KILLNEXT ;
            else
                state->NextCycle = ABORT1 ;
            }
        break ;
    case STM3 :
        state->doutenSig = LOW ;
        if (state->abortSig || state->Aborted) {
            if (state->Processor & ARM_Abort7_ProD &&
                ((state->Aborted != ARMul_DataAbortV &&
                state->abortSig) ||
                (state->Aborted = =ARMul_AddrExceptnV && (LSMNumRegs
                / 4) = = 1)))
                state->NextCycle = KILLNEXT ;
            else
                state->NextCycle = ABORT1 ;
            if (!state->Aborted)
                state->Aborted = ARMul_DataAbortV ;
            }
        break ;
    case UNDEF :
        PREFETCH(loaded,pc + instruction_size * 2) ;
        if (!IntPending(state)) {
            if (!state->cpaSig || !state->cpbSig) {
                UNDEF_UndefNotBounced ;
                }
            state->NcpiSig = HIGH ;
            ARMul_Abort(state,ARMul_UndefinedInstrV) ;
            }
        state->NextCycle = DESTPC1 ;
        break ;
    case LDC1 :
        PREFETCH(loaded,pc + instruction_size) ;
    case LDCBUSY :
        state->NextCycle = CoProNextState(state,LDC2, LDCBUSY) ;
        if (state->NextCycle = = LDC2) {
            BUSUSEDINCPCN ;
            if (BIT(21))
                LSBase = state->Base ;
            }
            break ;
    case LDC2 :
        if (state->cpaSig = = HIGH && state->cpbSig = = HIGH) {
            state->LSCActive = FALSE ;
            if (state->abortSig || state->Aborted) {
                state->NextCycle = ABORT1 ;
                }
            else
                state->NextCycle = NEWINSTR ;
```

APPENDIX A-continued

```
                }
            else
                if (state->abortSig && !state->Aborted)
                    state->Aborted = ARMul_DataAbortV ;
            break ;
        case STC1 :
            PREFETCH(loaded,pc + instruction_size * 2) ;
        case STCBUSY :
            state->NextCycle = CoProNextState(state,STC2,STCBUSY) ;
            if (state->NextCycle = = STC2) {
                BUSUSEDINCPCN ;
                if (BIT(21))
                    LSBase = state->Base ;
                }
            break ;
        case STC2 :
        case STC3 :
            if (state->cpaSig = = HIGH && state->cpbSig = = HIGH) {
                if (state->abortSig || state->Aborted) {
                    if (state->Processor & ARM_Abort7_Prop &&
                        ((state->Aborted != ARMul_DataAbortV &&
                        state->abortSig) ||
                        (state->Aborted = = ARMul_AddrExceptnV &&
                        state->LastCycle = = STC2)))
                        state->NextCycle = KILLNEXT ;
                    else
                        state->NextCycle = ABORT1 ;
                    }
                else
                    state->NextCycle = NEWINSTR ;
                state->LSCActive = FALSE ;
                state->doutenSig = LOW ;
                }
            else
                if (state->abortSig && !state->Aborted)
                    state->Aborted = ARMul_DataAbortV ;
            break ;
        case MCR1 :
            PREFETCH(loaded,pc + instruction_size * 2) ;
        case MCRBUSY :
            state->NextCycle = CoProNextState(state,MCR2,MCRBUSY) ;
            if (state->NextCycle = = MCR2) {
                BUSUSEDINCPCN ;
                }
            break ;
        case MCR2 :
            state->doutenSig = LOW ;
            break ;
        case MRC1 :
            PREFETCH(loaded,pc + instruction_size * 2) ;
        case MRCBUSY :
            state->NextCycle = CoProNextState(state,MRC2,MRCBUSY) ;
            if (state->NextCycle = = MRC2) {
                BUSUSEDINCPCN ;
                }
            break ;
        case CDP1 :
            PREFETCH(loaded,pc + instruction_size * 2) ;
        case CDPBUSY :
            state->NextCycle = CoProNextState(state,NEWINSTR,CDPBUSY) ;
            if (state->NextCycle = = NEWINSTR) {
                BUSUSEDN ;
                }
            break ;
            }
        }
state->LastCycle = state->NextCycle ;
switch (state->NextCycle) {    /* In a cycle based world, a new  */
                               /* instruction is just an         */
                               /* (important) state in a state   */
    case NEWINSTR :            /* machine                        */
        switch (state->NextInstr) {
        case SEQ :
        case NONSEQ :
            /* Inc PC, and fall through */
            state->Reg[15] = state->Reg[15] + instruction_size ;
        case PCINCEDSEQ :
        case PCINCEDNONSEQ :
            pc = pc + instruction_size ; /* Advance the dummy pc */
```

APPENDIX A-continued

```
            instr =]decoded ;
            decoded = loaded ;
            break ;
        case RESUME :
#ifdef MODE32
        state->Reg[15] = state->Reg[15] + PCR15DIFFERENCE ;
#else
        state->Reg[15] = (state->Reg[15] + PCR15DIFFERENCE) & R15PCBITS ;
#endif
        break ;
       default : /* The program counter has been changed */
        pc = state->Reg[15] ;
#ifdef CODE16
        state->Reg[15] = PCADDRESSBITS(pc) + PCR15DIFFERENCE ;
#else
        state->Reg[15] = (pc & R15PCBITS) + PCR15DIFFERENCE ;
#endif
        instr = decoded ;
        decoded = loaded ;
        break ;
    }
    NORMALCYCLE ;
  if ((state->Inted & 3) < 3) {
    if (!(state->Inted & 1))
        ARMul_Abort(state,ARMUl_FIQV) ;
    else
        ARMul_Abort(state,ARMul_IRQV) ;
    break ;
    }
#else /* Instruction based */
instruction_size = INSTRUCTIONSIZE;
has_halfword_prop = state->Processor & ARM_Halfword_Prop;
if   (state->NextInstr < PRIMEPIPE) {
    decoded = state->decoded ;
    loaded = state->loaded ;
    pc = state->pc ;
    }
```

APPENDIX B

Example of Core Image 102

|     |    |                                   |
|-----|----|-----------------------------------|
|     | /* | ARM7 CODE SEGMENT */              |
| A1. |    | /* ARM7 instructions */           |
| A2. |    | STARTVP                           |
| A3. |    | /* other ARM7 instructions */     |
| A4. |    | /* wait loop for VP */            |
|     | /* | ARM7 DATA SEGMENT */              |
| A5. |    | /* ARM7 data */                   |
|     | /* | VECTOR PROCESSOR CODE SEGMENT */  |
| A6. |    | /* Vector processor instructions */|
| A7. |    | JOIN                              |
|     | /* | VECTOR PROCESSOR DATA SEGMENT */  |
| A8. |    | /* Vector processor date */       |

APPENDIX C, ARMULATOR Documentation Containing "Application Note 32: The ARMulator", "Application Note 51: ARMulator Cache Models", and "Application Note 52: The ARMulator Configuration File" Appendix C not printed. Copies are available in the file jacket.

We claim:

1. A signal processor simulator for simulating parallel execution of instructions on a dual processor circuit, the signal processor simulator comprising:
    a first processor simulator for simulating execution of instructions to a first processor of the dual processor circuit;
    a second processor simulator for simulating execution of instructions to a second processor of the dual processor circuit;
    a shared memory to store values, said shared memory visible to said first processor simulator and said second processor simulator;
    a first clock simulator to simulate a clock for the first processor;
    a second clock simulator to simulate a clock for the second processor; and
    a synchronizer that compares the first clock simulator against the second clock simulator and processes an instruction to the processor simulator corresponding to the clock simulator that is furthest behind.

2. The signal processor simulator of claim 1 wherein the first processor simulator simulates a RISC processor.

3. The signal processor simulator of claim 1 wherein the first processor simulator is the ARMULATOR.

4. The signal processor simulator of claim 1 wherein the second processor simulator simulates a vector processor.

5. The signal processor simulator of claim 1 wherein the shared memory is visible to the first processor simulator and the second processor simulator.

6. The signal processor simulator of claim 5 wherein the shared memory contains values of registers of the first processor simulator that can be modified by the second processor simulator.

7. The signal processor simulator of claim 6 wherein the synchronizer contains a lookup table containing the clock cycles required by an instruction for the second processor and wherein the synchronizer:
    examines the lookup table to determine the clock cycles required for the instruction prior to executing the instruction on the second processor simulator; and
    following execution of the instruction, executes one or more other instructions on the first processor simulator until the duration of first processor operation simulated by the first processor simulator is at least as long as the duration of second processor operation simulated by the second processor simulator.

8. A computer implemented method for simulating operation of a dual processor circuit comprising:
providing in a computer storage medium:
an executable program containing instructions that execute on the dual processor circuit;
a first processor simulator for simulating execution of instructions to a first processor of the dual processor circuit;
a second processor simulator for simulating execution of instructions to a second processor of the dual processor circuit;
a synchronizer for interleaving execution of the instructions between the first processor simulator and the second processor simulator;
a first clock value representing a first processor clock;
a second clock value representing a second processor clock; and
a shared memory visible to the first processor simulator and the second processor simulator that contains one or more first register values required by the first processor simulator and one or more second register values required by the second processor simulator;
performing a first loop comprising the following computer implemented steps:
Fetch a first instruction from the executable program;
simulate execution of the first instruction on the first processor simulator if the first instruction does not signal for parallel processing;
simulate parallel processing if the first instruction signals for parallel processing wherein simulate parallel processing comprises a second loop comprising the following computer implemented steps:
compare the first clock value with the second clock value;
if the first clock value is lower than the second clock value:
fetch a second instruction from the executable program, simulate execution of the second instruction on the first processor simulator, and add to the first clock value a length of time required to execute the second instruction on the first processor;
if the first clock value is greater than or equal to the second clock value:
fetch a third instruction from the executable program, simulate execution of the third instruction on the second processor simulator and add to the second clock value a length of time required to execute the third instruction on the second processor; and
return to the first loop if the second processor simulator is no longer required; and
terminate the first loop when all instructions associated with the first processor simulator in the executable program have been simulated.

9. A computer implemented method for simulating operation of a dual processor circuit comprising:
providing in a computer storage medium:
an executable program containing instructions that execute on the dual processor circuit;
a first processor simulator for simulating execution of the instructions to a first processor of the dual processor circuit;
a second processor simulator for simulating execution of instructions to a second processor of the dual processor circuit;
a synchronizer for interleaving execution of the instructions between the first processor simulator and the second processor simulator;
a first clock value representing a first processor clock;
a second clock value representing a second processor clock;
a lookup table to represent an amount of time required to execute the instructions; and
a shared memory visible to the first processor simulator and the second processor simulator that contains one or more first register values required by the first processor simulator and one or more second register values required by the second processor simulator;
performing a first loop comprising the following computer implemented steps:
Fetch a first instruction from the executable program;
simulate execution of the first instruction on the first processor simulator if the first instruction does not signal for parallel processing;
simulate parallel processing if the first instruction signals for parallel processing wherein simulate parallel processing comprises a second loop comprising the following computer implemented steps:
compare the first clock value with the second clock value;
if the first clock value is lower than the second clock value:
fetch a second instruction from the executable program, simulate execution of the second instruction on the first processor simulator, and add to the first clock value a length of time required to execute the second instruction on the first processor;
if the first clock value is greater than or equal to the second clock value:
fetch a third instruction from the executable program, access the lookup table to determine the execution time required by the third instruction, simulate execution of the third instruction on the second processor simulator, add to the second clock value a length of time required to execute the third instruction on the second processor, fetch a predetermined number of instructions from the executable program based on the execution time required by the third instruction, simulate execution of the predetermined number of instructions on the first processor simulator; and
return to the first loop if the second processor simulator is no longer required; and
terminate the first loop when all instructions associated with the first processor simulator in the executable program have been simulated.

10. A computer with a central processing unit and a memory that implements a software program, wherein the software program comprises instructions for:
simulating execution of instructions to a first processor of a dual processor circuit;
simulating execution of instructions to a second processor of the dual processor circuit;
simulating a clock for the first processor simulation;
simulating a clock for the second processor simulation; and
synchronizing instructions, wherein synchronizing compares the first clock simulation to the second clock simulation and processes an instruction on the processor simulation corresponding to the clock simulation that is furthest behind.

11. A computer comprising:

a central processing unit;

a main memory, comprising a first memory location for simulating a first clock and a second memory location for simulating a second clock; and a software program, wherein the software program comprises instructions for:
   simulating execution of instructions to a first processor;
   simulating execution of instructions to a second processor; and
   synchronizing.

12. The computer of claim 11, wherein the synchronizer:

starts the first processor simulation;

fetches an instruction corresponding to the first processor simulation;

determines whether the instruction fetched is an instruction to start the second processor simulation;

based on said determination, starts the second processor simulation;

initializes the first and the second memory locations to an initial time value when the first and the second processor simulations are ready to start simulating instruction execution;

compares the values stored in the first and second memory locations to determine whether the first or the second clock simulation is further behind;

fetches an instruction corresponding to the first or the second processor simulation depending on the results of the determination;

wherein as part of each simulation of an execution of an instruction on the first or the second processor, the value stored in a respective memory location is increased by an amount corresponding to the amount of time required to execute the instruction.

* * * * *